United States Patent
Dunn et al.

(10) Patent No.: US 7,038,571 B2
(45) Date of Patent: May 2, 2006

(54) POLYMER THICK FILM RESISTOR, LAYOUT CELL, AND METHOD

(75) Inventors: Gregory J. Dunn, Arlington Heights, IL (US); Jovica Savic, Downers Grove, IL (US); Remy J. Chelini, Crystal Lake, IL (US)

(73) Assignee: Motorola, Inc., Schaumburg, IL (US)

( * ) Notice: Subject to any disclaimer, the term of this patent is extended or adjusted under 35 U.S.C. 154(b) by 4 days.

(21) Appl. No.: 10/448,993

(22) Filed: May 30, 2003

(65) Prior Publication Data

US 2004/0239474 A1    Dec. 2, 2004

(51) Int. Cl.
    *H01C 1/012*    (2006.01)
(52) U.S. Cl. ........................ 338/307; 338/295
(58) Field of Classification Search ............... 338/307, 338/309, 195, 295; 29/620
    See application file for complete search history.

(56) References Cited

U.S. PATENT DOCUMENTS

| | | | | |
|---|---|---|---|---|
| 4,293,839 A * | 10/1981 | Asada et al. | ................. | 338/309 |
| 4,783,642 A * | 11/1988 | Takada et al. | ............... | 338/309 |
| 4,788,524 A * | 11/1988 | Ozaki | ......................... | 338/309 |
| 4,974,596 A * | 12/1990 | Frank | ......................... | 600/485 |
| 5,363,084 A * | 11/1994 | Swinehart | .................... | 338/308 |
| 5,379,190 A * | 1/1995 | Hanamura et al. | ........... | 361/766 |
| 5,428,339 A * | 6/1995 | Das | ............................. | 338/195 |
| 5,521,576 A * | 5/1996 | Collins | ........................ | 338/307 |
| 5,619,189 A * | 4/1997 | Sugawara | ................... | 340/3.71 |
| 5,689,285 A * | 11/1997 | Asher | ......................... | 345/161 |
| 6,005,474 A * | 12/1999 | Takeuchi et al. | ............. | 338/320 |
| 6,111,494 A * | 8/2000 | Fischer et al. | .............. | 338/320 |
| 6,130,601 A * | 10/2000 | Brown et al. | ................ | 338/307 |
| 6,256,866 B1 | 7/2001 | Dunn et al. | | |
| 2002/0013997 A1* | 2/2002 | Dunn et al. | .................... | 29/620 |
| 2002/0104369 A1* | 8/2002 | Baker et al. | ............... | 73/31.06 |
| 2004/0080397 A1* | 4/2004 | Cubon et al. | ................ | 338/307 |
| 2004/0207452 A1* | 10/2004 | Vorenkamp | .................. | 327/379 |
| 2005/0050959 A1* | 3/2005 | Ooba et al. | ................... | 73/775 |

* cited by examiner

*Primary Examiner*—Tu Hoang

(57) ABSTRACT

A printed circuit polymer thick film (PTF) resistor includes tolerance control material that substantially surrounds the resistor body and significantly improves the linearity of resistance vs. resistor length, and significantly reduces resistor-to-resistor and board-to-board fabrication variances. In one embodiment, the tolerance control material is the same metallic material as the printed circuit conductors, and is formed in two finger patterns on each side of the resistor body, each finger pattern connected to one terminal pad of the resistor. A layout cell is used for fabricating the PTF resistor. A method is used for fabricating the PTF resistor.

4 Claims, 3 Drawing Sheets

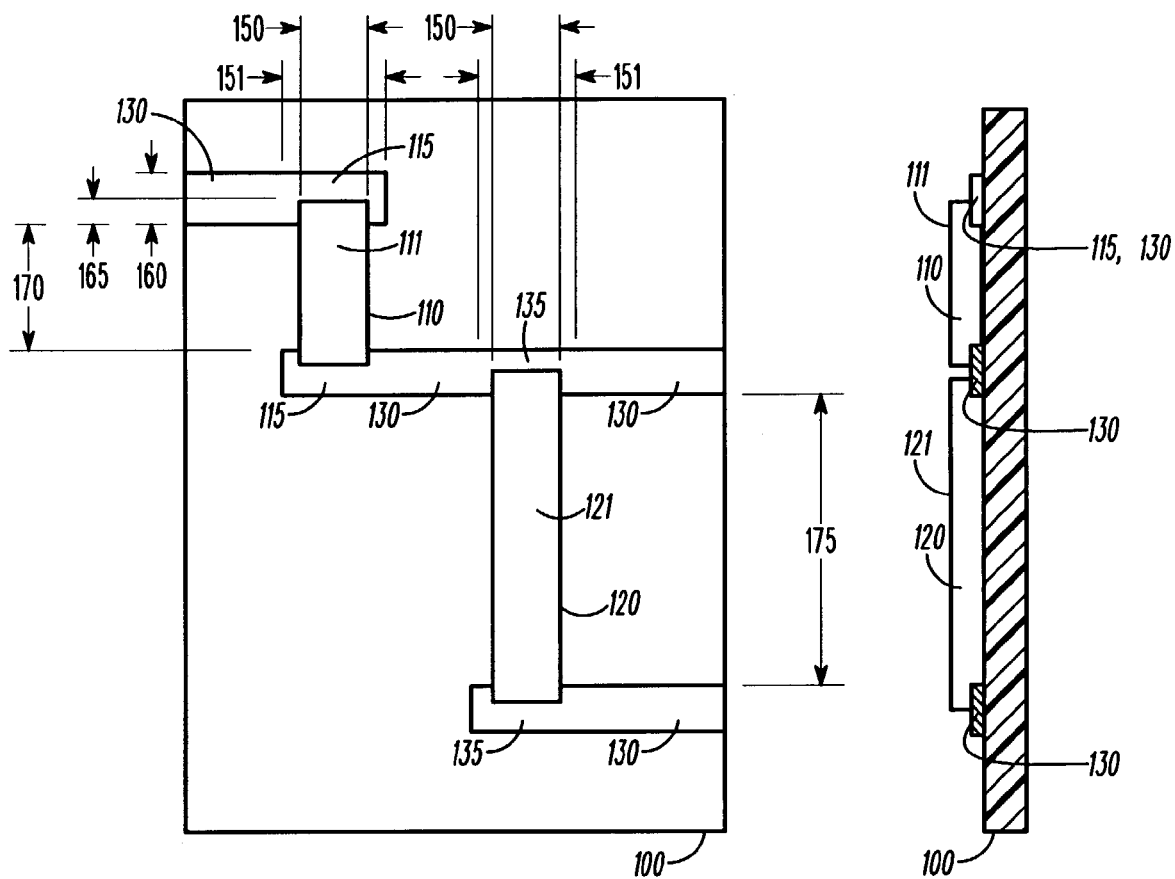
FIG. 1
—PRIOR ART—
FIG. 2
—PRIOR ART—
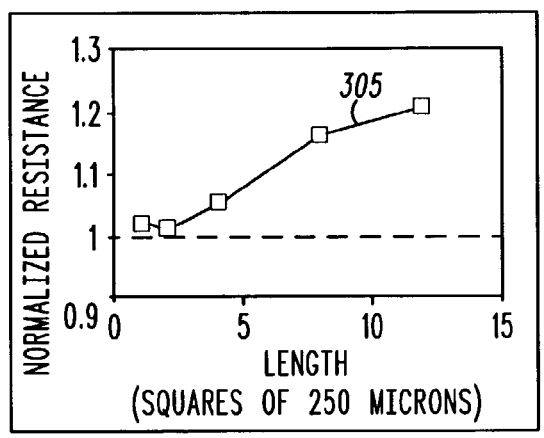
FIG. 3
—PRIOR ART—

POLYMER THICK FILM RESISTOR, LAYOUT CELL, AND METHOD

FIELD OF THE INVENTION

This invention is related to thick film resistors, and in particular, to polymer thick film resistors.

BACKGROUND

Thick-film resistors are employed in electronic circuits to provide small, inexpensive resistors of a wide range of values. Such resistors are typically formed by printing, such as screen printing, a thick-film resistive paste or ink on a substrate, which may be a printed wiring board (PWB), flexible circuit, or a ceramic or silicon substrate. Thick-film inks used on organic printed wiring board constructions are typically composed of an electrically conductive material, various additives used to favorably affect the final electrical properties of the resistor, an organic binder and an organic vehicle. After printing, the thick-film ink is typically heated to dry the ink and convert it into a suitable film that adheres to the substrate. When a polymer thick-film (PTF) ink is used, the organic binder is a polymer matrix material and the heating step serves to remove the organic vehicle and cure the polymer matrix material.

The electrical resistance of a thick-film resistor is dependent on the precision with which the resistor is produced, the stability of the resistor material, and the stability of the resistor terminations. The "x" and "z" dimensions (the width and thickness, respectively) of a rectangular PTF resistor are largely determined by a screen printing process, while the "y" dimension (the electrical length of the resistor), which is established by a separation distance of two terminations, can be designed to achieve a desired resistance. Conventional screen printing techniques generally employ a template with apertures bearing the image of the resistor to be created. The template, referred to as a screening mask, is placed above and in close proximity to the surface of the substrate on which the resistor is to be formed. The mask is then loaded with a PTF resistive ink, and a squeegee blade is drawn across the surface of the mask to press the ink through the apertures and onto the surface of the substrate. Copper or other metal terminations are typically formed prior to deposition of the ink by additive plating or subtractive etching of a copper foil or a copper foil and electrolytically plated copper. Both of these processes are capable of achieving a high level of edge definition that enables accurate determination of the electrical length (y) of the resistor.

Compared to many other deposition processes, screen printing is a relatively crude process. As a result, screen-printed PTF resistors are typically limited to dimensions of larger than about one-tenth millimeter. While the y dimension (electrical length) of a screen-printed PTF resistor can be accurately determined by using appropriate processes to form the terminations, control of the x and z (width and thickness) dimensions of a PTF resistor is fundamentally limited by the relatively coarse mesh of the screen and by ink flow after deposition. Control of resistor dimensions is further complicated by the variability of the surface on which the resistive ink is printed, due in large part to patterned metal interconnects for these resistors having typical thicknesses of about ten to thirty-five micrometers—that is, the print surface is non-planar. The non-planar board surface affects a uniform squeegee action across the surface, resulting in imperfect printing of the screen image and non-uniform deposition of the resistor ink. In addition, non-uniform temperatures across the body of the resistor during curing may also introduce variations in the resistivity. Consequently, the distributions of resistor values when fabrication of a circuit board is completed generally have unacceptable mean values and coefficients of variation, requiring empirical adjustments of the resistor dimensions during the process design stage, particularly for complex circuits with a wide range and number of different resistance values. Such empirical adjustments add time and cost to the resistor printing process, as new artwork must be generated, new screens fabricated, and additional prototypes fabricated to validate the changes.

From the above, it can be seen that what is needed is a method for forming PTF resistors with more predictable and consistent resistance values, without the need for empirical adjustments to align the actual mean values with the desired target resistance values.

BRIEF DESCRIPTION OF THE DRAWINGS

The present invention is illustrated by way of example and not limitation in the accompanying figures, in which like references indicate similar elements, and in which:

FIG. 1 is a plan view showing a portion of a partially fabricated circuit board comprising polymer thick film resistors, in accordance with prior art design and fabrication techniques;

FIG. 2 is an end view showing the portion of the circuit board illustrated in FIG. 1, in accordance with prior art conventional design and fabrication techniques;

FIG. 3 is a graph of normalized resistance versus resistor length for a test set of PTF resistors, in accordance with prior art design and fabrication techniques;

Figure 4:
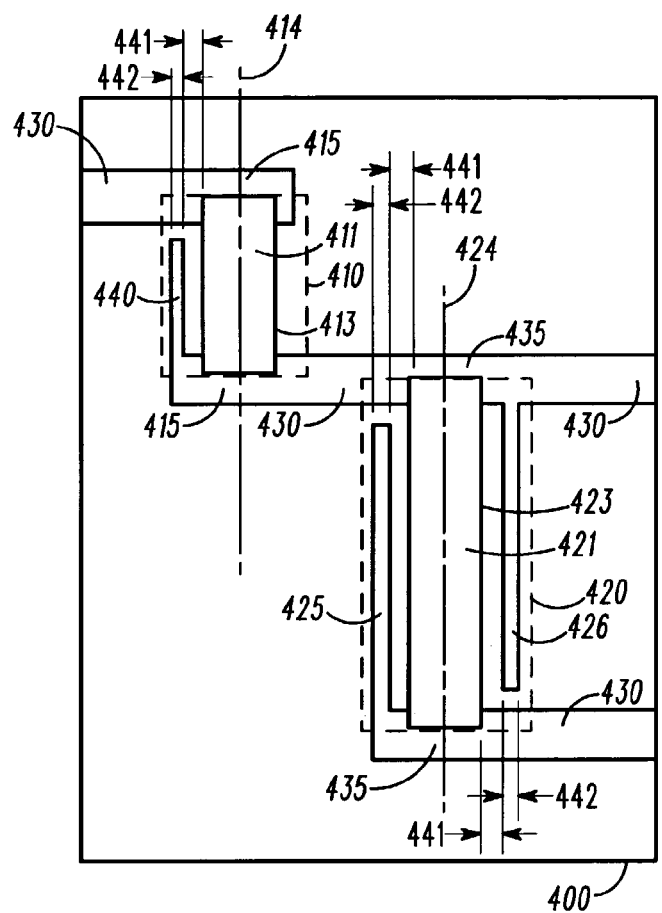
FIGS. 4 and 5 are a plan view and end view showing of a portion of a partially fabricated circuit board comprising polymer thick film resistors, in accordance with the preferred embodiment of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Before describing in detail the particular polymer thick film (PTF) resistor in accordance with the present invention, it should be observed that the present invention resides primarily in combinations of method steps and apparatus components related to PTF technology. Accordingly, the apparatus components and method steps have been represented where appropriate by conventional symbols in the drawings, showing only those specific details that are pertinent to understanding the present invention so as not to obscure the disclosure with details that will be readily apparent to those of ordinary skill in the art having the benefit of the description herein.

Referring to FIG. 1, a plan view of a portion of a partially fabricated circuit board comprising polymer thick film resistors is shown, fabricated in accordance with prior art design and fabrication techniques. The portion of a partially fabricated circuit board comprises a portion of a circuit substrate 100 having conductors 130 (also called printed wires or runners) fabricated from ½ ounce (about 17 micron-thick) copper plate. A polymer thick film (PTF) resistor 110 is connected to the runners 130 at two terminal pads 115 that are portions of the runners 130. Another PTF resistor 120 is connected to the runners 130 at two terminal pads 135 that are portions of the runners 130. The plan view is an idealized layout view, in the sense that the runners 130 and the PTF resistors 110,120 are shown with straight line outlines which do not reflect the parts of an actual fabricated circuit board. In actuality, the outlines have deviation from straightness. PTF resistors 110, 120 have nominal body widths 150. In some other printed circuit layouts (not shown herein), the terminal pads are wider than the runners and the boundaries of the terminal pads are more distinguishable from the runners, but for this instance, the terminal pad portions 115, 135 of the runners 130 are the same width as the runners and have a length 151 somewhat larger than the width 150 of the associated PTF resistors, to allow for fabrication tolerances (in particular, potential misalignment of the printed resistor). The portion of the substrate 100 comprises conventional organic circuit board material. Thick-film inks used to fabricate PTF resistors on organic circuit board material are typically composed of an electrically conductive material, various additives used to favorably affect the final electrical properties of the resistor, an organic binder and an organic vehicle. The PTF resistors are fabricated using conventional screen printing processes, in which PTF material is pushed into openings of a resistor mask having the shapes of the resistors 110, 120 by a squeegee, and cured. In the example shown in FIG. 1, the resistor body widths 150 are designed to be approximately 250 microns and the width 160 of the runners is designed to be approximately 250 microns. The distance 170 between the edges of terminal pads 115 is designed to be approximately 500 microns. The distance 175 between the edges of terminal pads 135 is designed to be approximately 1000 microns. Thus, resistor 110 is a 2 square resistor and resistor 120 is a four square resistor. The layout of the resistors 110, 120 is designed to provide an overlap 165 of approximately 125 microns on each terminal pad 115, 135.

Referring to FIG. 2, an end view of the portion of the circuit board illustrated in FIG. 1 is shown, fabricated in accordance with prior art conventional design and fabrication techniques. Again, this is an idealized layout drawing. Because conventional techniques are used to fabricate the resistors 110, 120, the top surfaces 111, 121 (FIGS. 1 and 2) of the bodies of the resistors 110, 120 vary from the ideal shown in the layout drawings.

Referring to FIG. 3, a graph of normalized resistance versus resistor length for a test set of PTF resistors is shown, in accordance with prior art design and fabrication techniques. The resistors in the set have nominal widths of 250 microns. Conventional PTF materials were blended to achieve a 2 kohm/square characteristic. The PTF resistors were printed on a 250 micron thick FR4 circuit substrate. The graph plots results for resistors from 1 to 12 squares, which have lengths from approximately 0.25 millimeters to approximately 4 millimeters. The normalized resistance is the ratio of each actual resistance to design resistances at each design length, with an ideal normalized resistance therefore being 1. It can be seen that the variance from the ideal is up to 20%, which is not acceptable for producing high quality electronic circuits. The result is that a circuit board layout for conventional PTF resistors of these dimensions has to be modified and tested a number of times to achieve acceptable resistor tolerances.

While not wishing to be bound by theory, the inventors believe the variation of actual resistor resistance from the design resistance is caused by non-uniformity of the resistor body resulting from two operations during fabrication: flexing of the edge of the squeegee during deposition of the PTF resistor material and non-uniform heating of the resistor body during curing. The flexing of the squeegee blade during deposition of the material is believed to be the predominate problem. Non-uniform heating is theorized to be due to the high thermal conductivity of the terminal pads raising the temperature of the ends of the resistor bodies faster than the middle sections (which are cooled by the evaporation of solvent from the PTF material).

Figure 5:
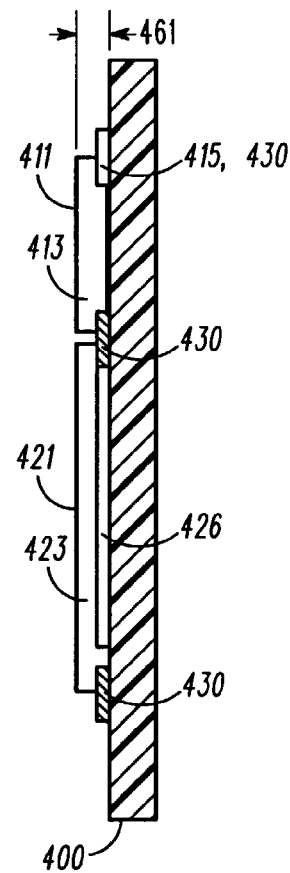

Referring now to FIGS. 4 and 5, a plan view and end view of a portion of a partially fabricated circuit board comprising polymer thick film resistors are shown. The circuit board is exemplary of circuit boards that can be fabricated in accordance with the preferred embodiment of the present invention. The PTF resistors 410, 420 are designed to have the same resistance values as those described with reference to FIGS. 1 and 2. The partially fabricated portion of a circuit board comprises a portion of a circuit substrate 400, having conductors 430 (also known as runners or printed wires). A polymer thick film (PTF) resistor 410 is connected to the runners 430 at two terminal pads 415 that are portions of the runners 430. Another PTF resistor 420 is connected to the runners 430 at two terminal pads 435 that are portions of the runners 430. As with reference to FIGS. 1 and 2, the plan view is an idealized layout view. PTF resistors 410, 420 have the same nominal body widths as PTF resistors 110, 120 (FIGS. 1 and 2). The portion of the circuit substrate 400 comprises a portion of a conventional organic circuit board or circuit board of other material suitable for screen printing of PTF resistors, such as a ceramic, liquid crystal polymer, or flexible circuit substrate. The PTF resistor 410 comprises a tolerance control material 440 that is disposed essentially parallel to a longitudinal axis 414 of a resistor body 413 of the PTF resistor 410. Similarly, the PTF resistor 420 comprises tolerance control material 425, 426 that is disposed essentially parallel to a longitudinal axis 424 of a resistor body 423 of the PTF resistor 420. The PTF resistor bodies 413, 423 comprise any PTF material compatible with screen printing processes, and can be a conventional PTF material. The PTF resistor bodies 413, 423 are fabricated using a screen printing or stencil printing process, in which PTF material is pushed through openings of a resistor mask having the shapes of the resistors 410, 420 by a squeegee, and then cured using heat. The resistor body widths of resistors 410, 420 are preferably in a range of 50 to 400 microns. The width of the resistors 410, 420 in the examples of FIGS. 4 and 5 are nominally 250 microns. The resistor body height 461 is in a range of 5 to 25 microns, as appropriate for the PTF material being used and the screen printing tools (the resistor mask and the squeegee). The height of the resistors 410, 420 in the examples of FIGS. 4 and 5 is nominally 12 microns. Resistor 410 is designed to be a 2 square resistor, and resistor 420 is designed to be a 4 square resistor. The layout of the resistors 410, 420 is designed to provide an overlap of approximately 125 microns on each terminal pad 415, 435, but other overlaps could be used and may be appropriate for different sized resister bodies and/or runner widths. In accordance with the preferred embodiment of the present invention, the terminal pads 415, 435 comprise a silver plated layer of copper that is approximately 12 microns thick, wherein the copper is formed from ½ ounce copper plate on an FR4 circuit substrate, and the silver is a 0.05–1.0 micron thick layer of co-deposited silver and polymer, such as the commercially available Alpha Level™ and Sterling™ immersion silver finishes available from Cookson Electronics of Jersey City, N.J. and MacDermid, Inc. of Waterbury, Conn., respectively. However, other printed wire materials or combinations of materials could be used, such as indium tin oxide (ITO), gold, nickel, nickel plated copper, palladium plated copper, or multilayer combinations thereof, such as gold/nickel/copper or palladium/nickel/copper. The runners may comprise the same metal layers, or they may, outside of the terminal pads 415, 435, comprise only copper.

The tolerance control material 440, 425, 426 is preferably the same metallic material as the terminal pads 415, 435, and is preferably joined (electrically connected, and therefore, thermally connected) to the runners 430 at what are essentially the terminal pads 415, 435 of the resistors 410, 420. The connection of the tolerance control material to the terminal pads 415, 435 is preferable but not necessary. The preferable runner material is formed as described above, by performing immersion plating, with silver, of a printed circuit board having a copper runner pattern formed thereon using conventional lithography and etching techniques. Other types of tolerance control materials can alternatively be used. When other materials are used, they preferably are fabricated to have their surface essentially co-planar with the runners, and they should be solidified before the squeequee is used to deposit the resistor body material in the mask apertures. Other materials that have high thermal conductivity may provide more benefits than those with lower thermal conductivity. The tolerance control material 440, 425, 426 may be on only one side of the PTF resistor body, as in the example of PTF resistor 410, or on both sides, as in the example of PTF resistor 420. Having the tolerance control material on both sides of the PTF resistor body is preferable for all resistors of ½ square or more, but is particularly important for resistors of 2 squares or more. When the tolerance control material is placed on both sides of the PTF resistor body, the body of the resistor is partially surrounded by the tolerance control material. This can also be described as the tolerance control material essentially surrounding the body without joining the body, except at the termination pads. When the tolerance control material is on only one side of the resistor body and the PTF resistor's longitudinal axis is parallel to the edge of the squeegee as it passes over the resistor body pattern in the resistor mask, it is preferably on the side from which the squeegee edge moves over the resistor. It will be appreciated that by using the runner material for the tolerance control material, the number of deposition steps used to fabricate a printed circuit board is typically reduced in comparison to using differing materials.

The tolerance control material 440, 425, 426 has a separation 441 from (or, proximity 441 to) the resistor bodies 413, 423, which is the minimum distance of the tolerance control material 440, 425, 426 in its actual (fabricated) position on the circuit substrate 400 from the edges of the associated resistor body 413, 423, whatever the actual shapes of the resistor body and tolerance control material may be. For resistors having body widths in a range of ~50 to 400 microns, the separation is preferably in the range of 125 to 250 microns. The separation is preferably non-zero; i.e., the tolerance control material should not join or touch the resistor body. This criteria is particularly important when the tolerance control material is electrically conductive, because contact between the two could severely affect the resistance of the PTF resistor. Another way of describing the criteria of non-zero separation is that the tolerance control material must be separated from the resistor body.

The tolerance control material is shown in FIG. 4 as having a generally rectangular shape with a width 442. It is preferred that the width be approximately 75 microns when using the preferred electrically conductive material (the material that is used for the runner and terminal pads). Larger widths can be used but they increase the footprint of the resistors 410, 420. Other materials may require larger minimum widths as determined by experimentation. The shape of the tolerance control material need not be rectangular. For example, generally half or ¾ round test pads having a diameter of 200 microns extending away from the resistor body could be incorporated in the tolerance control material when it is electrically conductive and connected to a resister terminal pad as an added feature.

Top surfaces 411, 421 (FIGS. 4 and 5) of the bodies of the resistors 110, 120 vary from the ideal shown in the layout drawings, but it is deduced that the variances are substantially less than those of conventionally fabricated PTF resistors. The reduction in variance is theorized to be effected by a stabilization of the squeegee edge as it moves over the resistor pattern in the resistor mask due to the presence of the tolerance control material along the resistor body and may be also due in part to more uniform heating of the resistor body by the presence of tolerance control material having a high thermal conductivity.

Figure 6:
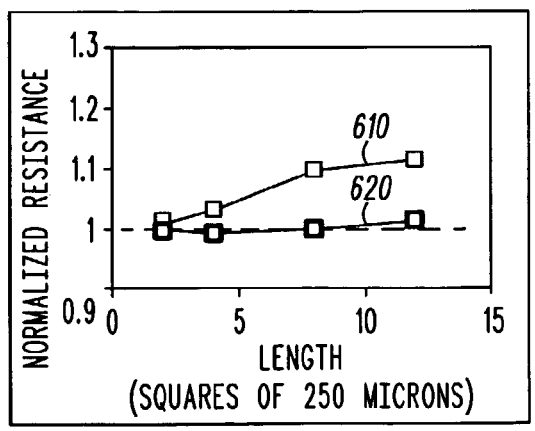
FIG. 6 is a graph of normalized resistance versus resistor length for two test sets of PTF resistors, in accordance with the preferred embodiment of the present invention.

Referring to FIG. 6, a graph of normalized resistance versus resistor length for two test sets of PTF resistors is shown, in accordance with the preferred embodiment of the present invention. The resistors have nominal widths of 250 microns. Conventional PTF materials were blended to achieve a 2 kohm/square characteristic. The tolerance control material was the termination pad material; it was patterned as two fingers that were 75 microns wide and extended from opposite terminal pads of each resistor, parallel to the resistor bodies, to end approximately 100 microns from the termination pad material at the other end of each resistor, substantially as depicted in FIGS. 4 and 5 (but not to scale). The fingers had actual separations of approximately 200 microns from the resistor bodies. The PTF resistors were printed on a 250 micron thick FR4 circuit substrate. A second set of PTF resistors was constructed the same way, except that only one finger was used in each resistor. The graph plots results for resistors from 1 to 12 squares, which have lengths from approximately 0.25 millimeters to approximately 4.0 millimeters. Plot 610 shows the results for resistors having one finger, and plot 620 shows the results for resistors having two fingers. It can be seen that the variance from the ideal for resistors having one finger of copper-silver tolerance control material is a maximum of about 10%, and the variance is about 2% for resistors having two fingers of the copper-silver tolerance control material. The result is that a circuit board layout for these unique PTF resistors can be designed on the first pass to achieve a very acceptable level of actual-to-target variations in resistor values. This significantly improves the linearity of resistance vs. resistor length, and significantly reduces resistor-to-resistor and board-to-board fabrication variances. The tolerance control material has a proximity to the polymer based material that is designed to reduce deflection variations of a squeegee during application of the polymer based material onto the printed circuit substrate, and furthermore has a width and has a proximity to the polymer based material that is designed to reduce temperature variations of the polymer based material during curing of the polymer based material.

Figure 7:
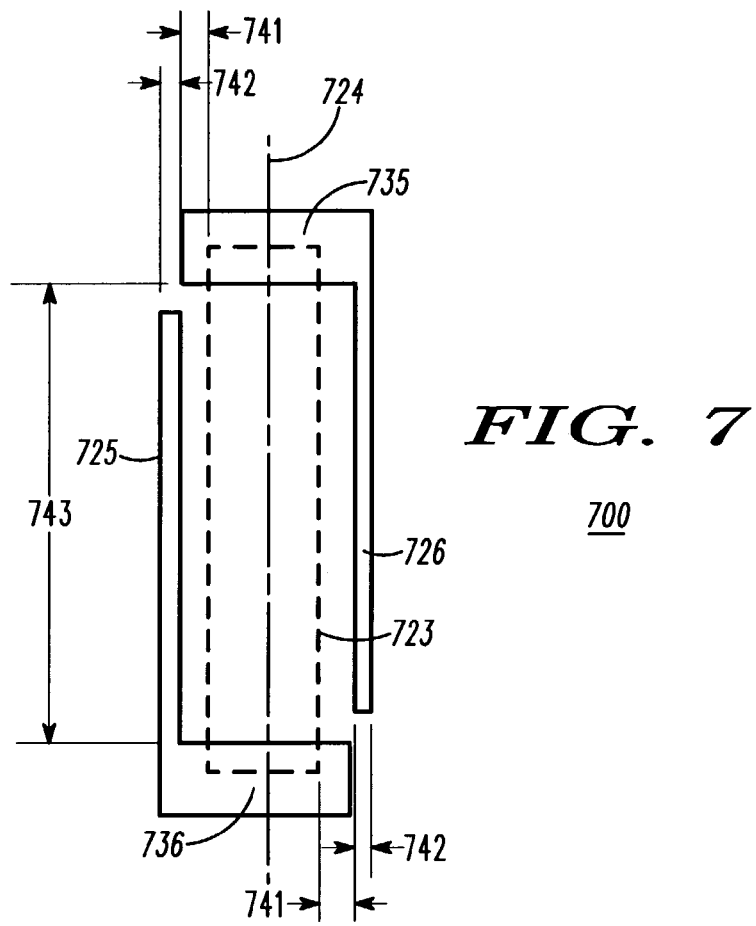
FIG. 7 represents an exemplary layout cell for a polymer thick film (PTF) resistor having a body with opposite ends located on a longitudinal axis of the body, in accordance with the preferred embodiment of the present invention.

Referring to FIG. 7, an exemplary layout cell 700 for a polymer thick film (PTF) resistor having a body with opposite ends located on a longitudinal axis of the body is shown, in accordance with the preferred embodiment of the present invention. The exemplary layout cell 700 is used for fabricating a printed circuit metallic conductor pattern, including tolerance control material made of the metallic conductor material, on a printed circuit substrate. The printed circuit metallic conductor pattern (the layout cell 700) is suitable for fabricating a PTF resistor having a body 723 (shown as a dotted line in FIG. 7 because it is not formed in the same process steps as the metallic conductors) of a particular size (e. g., 250 microns by 1000 microns; i.e., a 250 micron-wide 4 square PTF resistor). The body 723 has opposite ends located on a longitudinal axis 724 of the body 723. The layout cell 700 comprises two termination pad patterns 735, 736 and a tolerance control material pattern 725, 726. The two termination pad patterns 735, 736 have a pad separation 743 and have the termination pad patterns 735, 736 shaped so that the termination pads formed from the pattern will be at least partially under each of the opposite ends of the body. The layout cell 700 has a separation 741 of the tolerance control material pattern 725, 726 from the edges of the associated resistor body 723. Under normal variations encountered during fabrications of multiple printed circuits using a particular printed resistor mask pattern, the actual position of the edges of the PTF resistor body can vary from their cell layout position relative to the circuit substrate, and the actual position of the tolerance control material can vary from their cell layout position relative to the circuit substrate. The separation of the tolerance control material pattern from the body (or proximity of the tolerance control material pattern to the body) in the layout cell 700 is designed to provide for an actual separation, or actual proximity, on the fabricated printed circuit board by taking into account these fabrication variances. As described above with reference to FIGS. 4 and 5, the tolerance control material need not be a rectangle and need not be joined to the two termination pads. When the tolerance control material has an edge proximate to the resistor body that is not parallel to the proximate edge of the resistor body, then separation and proximity are determined as the minimum distance between the tolerance control material edge and the resistor body edge. The tolerance control material pattern is positioned relative to the two terminal pad pattern in a manner designed to provide an actual proximity of the tolerance control material to the body within a range that improves uniformity of the resistance of the polymer thick film resistor along the longitudinal axis during printing and curing of the polymer based material. The proximity can be determined by experiment using a particular tolerance control material and resistor dimensions. For example, In some embodiments in which the tolerance control material is made of the same conductive metal as the printed circuit board runners, the tolerance control material pattern is positioned relative to the two terminal pad pattern to achieve a separation from the body that is in the range of 125 to 250 microns, when providing for a body width that is in the range of 50 to 400 microns. A criterion in accordance with one embodiment of the present invention is that the tolerance control material pattern is positioned relative to the two terminal pad pattern in order to provide a proximity to the body that is designed to reduce height variations of the polymer based material during application of the polymer based material onto the printed circuit substrate, and thereby reduce the variation of resistor to resistor values on a printed circuit board. Also, in some embodiments, the tolerance control material pattern has a composition, has a width, and is positioned relative to the two terminal pad pattern to provide a proximity to the resistor body that is designed to reduce temperature variations of the polymer based material during curing of the polymer based material.

Figure 8:
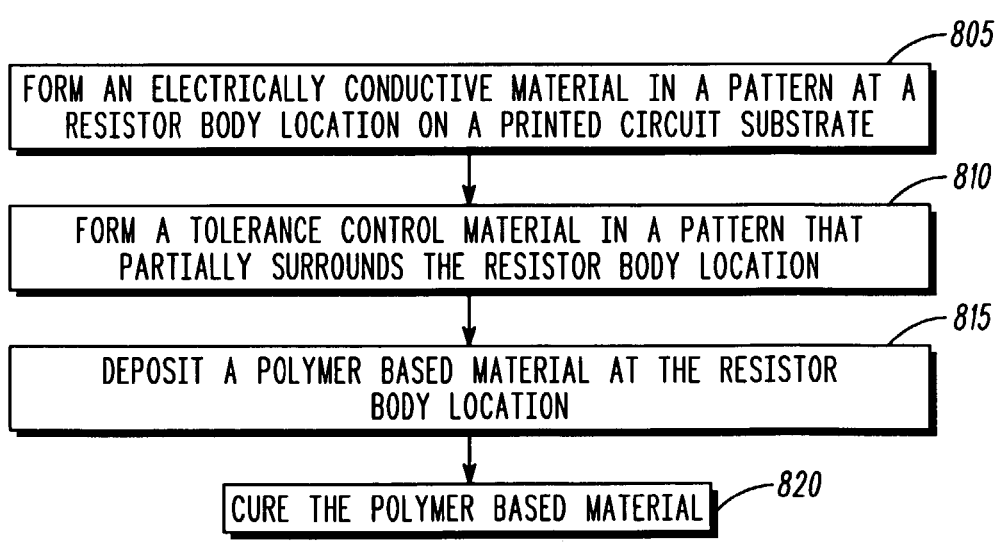
FIG. 8 is a flow chart showing some steps of a method for making a polymer thick film resistor, using the techniques described in this disclosure.

Referring to FIG. 8, a flow chart shows some steps of a method for making a polymer thick film resistor, using the techniques described in this disclosure. The steps need not necessarily be performed in the order described. At step 805, an electrically conductive material is formed in a pattern on a printed circuit substrate. The pattern of electrically conductive material comprises a termination pad pattern located under each of two opposite ends of a resistor body location on a longitudinal axis of the resistor body location. A tolerance control material is formed at step 810 in a pattern that partially surrounds the resistor body location. In the preferred embodiment, the tolerance control material is the electrically conductive material, and steps 805 and 810 can be combined. At step 815, a polymer based material is deposited at the resistor body location, and the polymer based material is cured at step 820.

In step 815, the depositing of the polymer based material comprises screen printing the polymer based material using a squeegee. In step 810, the forming of the tolerance control material comprises forming the tolerance control material to have a surface that is approximately coplanar with a surface of the termination pads. At step 815, variations in height of the polymer based material are reduced during the depositing of the polymer based material by a proximity of the tolerance control material formed at step 810 to the polymer based material. At step 820, temperature variations of the polymer based material during curing of the polymer based material are reduced by a combination of a thermal conductivity of the tolerance control material formed at step 810 and a proximity of the tolerance control material to the polymer based material.

In the foregoing specification, the invention and its benefits and advantages have been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising. The term "coupled", as used herein with reference to electro-optical technology, is defined as connected, although not necessarily directly, and not necessarily mechanically. The term "program", as used herein, is defined as a sequence of instructions designed for execution on a computer system. A "program", or "computer program", may include a subroutine, a function, a procedure, an object method, an object implementation, an executable application, an applet, a servlet, a source code, an object code, a shared library/dynamic load library and/or other sequence of instructions designed for execution on a computer system. A "set" as used herein, means a non-empty set (i.e., for the sets defined herein, comprising at least one member)

What is claimed is:

1. A polymer thick film resistor, comprising:
    a resistor body fanned of a polymer based material disposed on a printed circuit substrate and electrically coupled to two termination pads located at opposite ends of the resistor body on a longitudinal axis of the resistor body, wherein the resistor has a body length parallel to the longitudinal axis and a body width perpendicular to the longitudinal axis; and
    an electrically conductive tolerance control material formed of the same material from which the two termination pads are formed, that forms an extension of at least one of the two termination pads, that is essentially parallel to the longitudinal axis, that has a separation from the resistor body that is in a range of 1 to 250 microns, and that terminates within 100 microns of the oilier of the two termination pads.

2. A printed circuit board comprising a plurality of printed polymer thick film resistors, each such printed polymer thick film resistor comprising:
    a resistor body formed of a polymer based material disposed on a printed circuit substrate and electrically coupled to two termination pads located at opposite ends of the resistor body on a longitudinal axis of the resistor body, wherein the resistor has a body length parallel to the longitudinal axis and a body width perpendicular to the longitudinal axis; and
    a tolerance control material formed of the same material from which the two termination pads are formed, that forms an extension of at least one of the two termination pads, that is essentially parallel to the longitudinal axis, that has a separation from the resistor body that is in a range of 1 to 250 microns, and that terminates within 100 microns of the other of the two termination pads.

3. A polymer thick film resistor, comprising:
    a resistor body formed of a polymer based material disposed on a printed circuit substrate and electrically coupled to two termination pads located at opposite ends of the resistor body on a longitudinal axis of the resistor body, wherein the resistor has a body length parallel to the longitudinal axis and a body width perpendicular to the longitudinal axis; and
    an electrically conductive tolerance control material formed of the same material from which the two termination pads are formed, that forms an extension of at least one of the two termination pads, that is essentially parallel to the longitudinal axis, that has a separation from the resistor body that is in a range of 1 to 250 microns, and that terminates approximately 100 microns from the other of the two termination pads.

4. A printed circuit board comprising a plurality of printed polymer thick film resistors, each such printed polymer thick film resistor comprising:
    a resistor body formed of a polymer based material disposed on a printed circuit substrate and electrically coupled to two termination pads located at opposite ends of the resistor body an a longitudinal axis of the resistor body, wherein the resistor has a body length parallel to the longitudinal axis and a body width perpendicular to the longitudinal axis; and
    a tolerance control material formed of the same material from which the two termination pads are formed, that forms an extension of at least one of the two termination pads, that is essentially parallel to the longitudinal axis, that has a separation from the resistor body that is in a range of 1 to 250 microns, and that terminates approximately 100 microns from the other of the two termination pads.

* * * * *